United States Patent
Patent et al.

(10) Patent No.: US 11,480,316 B2
(45) Date of Patent: Oct. 25, 2022

(54) LIGHT CONVERSION PACKAGE

(71) Applicant: Lumileds LLC, San Jose, CA (US)

(72) Inventors: Genia Patent, Eindhoven (NL);
Christian Kleijnen, Ell (NL);
Alexander Vdovin, Maarheeze (NL);
Ralph Maessen, Aachen (DE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/312,830

(22) PCT Filed: Jun. 14, 2017

(86) PCT No.: PCT/EP2017/064577
§ 371 (c)(1),
(2) Date: Dec. 21, 2018

(87) PCT Pub. No.: WO2017/220411
PCT Pub. Date: Dec. 28, 2017

(65) Prior Publication Data
US 2019/0219248 A1 Jul. 18, 2019

(30) Foreign Application Priority Data
Jun. 22, 2016 (EP) .................................. 16175613

(51) Int. Cl.
*F21V 9/32* (2018.01)
*F21V 29/70* (2015.01)
(Continued)

(52) U.S. Cl.
CPC ............... *F21V 9/32* (2018.02); *F21S 41/16* (2018.01); *F21S 41/176* (2018.01); *F21V 7/04* (2013.01);
(Continued)

(58) Field of Classification Search
CPC ..... H01L 33/46; H01L 33/507; H01L 33/644; H01L 33/50; H01L 33/64; H01L 33/60;
(Continued)

(56) References Cited

U.S. PATENT DOCUMENTS 5,479,328 A * 12/1995 Lee .......................... F21V 7/005
362/216
8,704,261 B2 4/2014 Komatsu et al.
(Continued)

FOREIGN PATENT DOCUMENTS

JP 2010-219264 A 9/2010
JP 2011-129376 A 6/2011
(Continued)

OTHER PUBLICATIONS

Thermal Resistance Theory and Practice, Infineon Technologies, 2000, pp. 1-14 (Year: 2000).*
(Continued)

*Primary Examiner* — Galina G Yushina
(74) *Attorney, Agent, or Firm* — Volpe Koenig

(57) ABSTRACT

A light conversion package for a semiconductor light source includes a light conversion block, a substrate, and an interconnector. The light conversion block is positioned to receive incident light from the semiconductor light source and acts to convert the incident light to light having a different spectral distribution. The interconnector attaches the light conversion block to the substrate and limits a thermal resistance between the light conversion block and the substrate so that the substrate can efficiently sink heat from the light conversion block. The interconnector and the substrate together may still provide high reflectivity.

7 Claims, 3 Drawing Sheets

(51) Int. Cl.

| | |
|---|---|
| *F21S 41/176* | (2018.01) |
| *H01L 33/50* | (2010.01) |
| *F21V 13/08* | (2006.01) |
| *H01L 33/46* | (2010.01) |
| *H01L 33/64* | (2010.01) |
| *H01L 31/055* | (2014.01) |
| *H01L 27/30* | (2006.01) |
| *F21S 41/16* | (2018.01) |
| *F21V 7/04* | (2006.01) |
| *F21Y 115/30* | (2016.01) |

(52) U.S. Cl.
CPC ............ *F21V 13/08* (2013.01); *F21V 29/70* (2015.01); *H01L 27/30* (2013.01); *H01L 31/055* (2013.01); *H01L 33/46* (2013.01); *H01L 33/507* (2013.01); *H01L 33/644* (2013.01); *F21Y 2115/30* (2016.08)

(58) Field of Classification Search
CPC ..... H01L 2924/401; H01L 2224/81224; H01L 2224/75158; F21V 9/21; F21V 7/04; F21V 13/08; F21V 29/70; F21S 41/16; F21S 41/176; F21Y 2115/30; F21K 9/64
See application file for complete search history.

(56) References Cited

U.S. PATENT DOCUMENTS

| | | | |
|---|---|---|---|
| 9,970,605 B2 | 5/2018 | Owada | |
| 10,047,919 B2 | 8/2018 | Inoue et al. | |
| 10,347,801 B2 | 7/2019 | Schug | |
| 2009/0272997 A1* | 11/2009 | Shum | H01L 33/405 257/98 |
| 2010/0295438 A1* | 11/2010 | Ott | F21V 9/30 313/46 |
| 2012/0018764 A1* | 1/2012 | Choi | H01L 33/0025 257/99 |
| 2012/0057364 A1 | 3/2012 | Kishimoto et al. | |
| 2012/0067629 A1 | 3/2012 | Jang et al. | |
| 2012/0228471 A1* | 9/2012 | Van Bommel | F21V 14/003 250/206 |
| 2012/0230007 A1* | 9/2012 | Kawakami | F21V 9/14 362/19 |
| 2013/0001782 A1* | 1/2013 | Otsuka | H01L 24/27 257/751 |
| 2013/0062655 A1 | 3/2013 | Ng et al. | |
| 2014/0176915 A1 | 6/2014 | Yamamoto | |
| 2014/0233210 A1 | 8/2014 | Owada | |
| 2015/0123253 A1* | 5/2015 | Hwang | H01L 24/29 257/676 |
| 2015/0308637 A1 | 10/2015 | Chang et al. | |
| 2016/0135684 A1* | 5/2016 | Kappel | H01Q 7/00 600/301 |
| 2016/0245494 A1* | 8/2016 | Weber | C04B 37/026 |
| 2016/0258597 A1* | 9/2016 | Adema | H01L 33/508 |
| 2016/0312978 A1* | 10/2016 | Park | F21S 41/176 |
| 2016/0327244 A1* | 11/2016 | Annen | F21K 9/64 |
| 2019/0219248 A1* | 7/2019 | Patent | F21S 41/176 |

FOREIGN PATENT DOCUMENTS

| | | |
|---|---|---|
| JP | 2012-185403 A | 9/2012 |
| JP | 2015-050124 A | 3/2015 |
| JP | 2015060789 A | 3/2015 |
| WO | 2014/065051 A1 | 5/2014 |
| WO | 2016034482 A1 | 3/2016 |

OTHER PUBLICATIONS

Communication pursuant to Article 94(3) EPC dated Nov. 25, 2020 for European Patent Application No. 17730153.8.
Communication pursuant to Article 94(3) EPC dated Jun. 16, 2020 for European Patent Application No. 17730153.8.
Communication pursuant to Article 94(3) EPC dated Jan. 17, 2020 for European Patent Application No. 17730153.8.
International Preliminary Report on Patentability dated Dec. 25, 2018 for PCT International Application No. PCT/EP2017/064577.
Extended European Search Report dated Nov. 4, 2016 for European Patent Application No. 16175613.5.
International Search Report and Written Opinion dated Aug. 21, 2017 for PCT International Application No. PCT/EP2017/064577.

* cited by examiner

LIGHT CONVERSION PACKAGE

BACKGROUND

Projection systems, spot lighting, theatre and architectural lighting, automotive lamps, and many other lighting systems require bright light sources and may benefit when the light sources are compact. For example, if a light source delivering high luminous flux is smaller, a lighting system may be able to use the light source with smaller and less expensive optical elements. Light sources with compact form factors may also allow greater freedom in the design and styling of lamps.

Semiconductor light sources such as Light Emitting Diodes (LEDs) and laser diodes can provide compact energy efficient lighting, and lamps have been developed that produce relatively high luminous flux using semiconductor light sources. As an example, current LED technology can produce white light using a blue-emitting LED die and a phosphor. In operation, blue radiation from the LED excites the phosphor causing the phosphor to re-emit part of the excitation energy as longer wavelength light spread over a broad spectrum. The converted luminescence from the phosphor together with unconverted blue light from LED may provide light with an overall white spectrum. The brightness that can be achieved with this LED technology has limitations. Current LED chips having sizes of about 1 mm² or less and can typically deliver a maximum luminous flux of about 200 Lm, and with high-power LED technology, luminance levels of about 100 to 200 MCd/m² can be achieved using those LED chips. Achieving higher luminance levels, e.g., greater than about 500 MCd/m², in a small form factor with LEDs may be impracticable because of the available size and luminance of the LED chips, the size of accompanying phosphors, and the amount of heat that may be generated in the small area of the phosphors.

BRIEF DESCRIPTION OF THE DRAWINGS

Use of the same reference symbols in different figures indicates similar or identical items.

DETAILED DESCRIPTION

A high-luminance lighting system employs an interconnector to attach light conversion block, e.g., a phosphor, to a heat-conductive substrate and to control or minimize thermal resistance between the light conversion block and the substrate while maintaining high reflectivity. The high-luminance lighting system may employ one or more remote semiconductor light sources, e.g., one or more laser chips, for high power pumping of a small light conversion block, e.g., a light conversion block with an area less than about 0.5 mm². Because of the small size and high power pumping, a light conversion block can produce high luminance, e.g., more than about 500 MCd/m². A high brightness white light source can be realized, for example, using a small light conversion block (phosphor), which is exposed to light from a high power (blue) laser diode. The interconnectors disclosed herein can provide low thermal resistance, e.g., less than 10 K mm²/W, to conduct and remove heat generated in the light conversion block due to conversion of pump light to longer wavelengths (Stokes shift losses). The interconnectors can thus control or maximize thermal conductivity to a heat-conductive substrate and can do so without significant adverse effect on light reflected from the substrate. An interconnector may, for example, provide a reflectivity greater than 85%, greater than 90%, or even greater than 97% for incident and converted light from a light conversion block.

Figure 1:
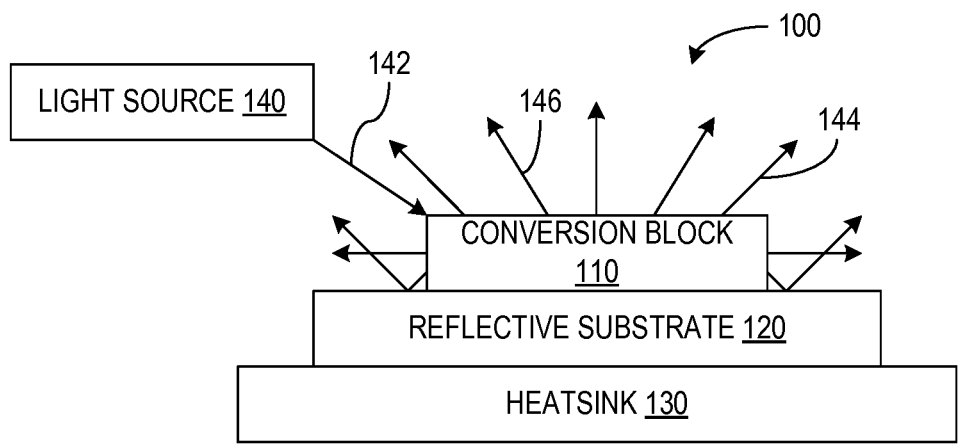
FIG. 1 shows semiconductor lamp in accordance with an implementation employing a reflective light-conversion package.

FIG. 1 schematically illustrates an example of a lighting system 100 that generates white light. Lighting system 100 may, for example, be a lamp for illuminating an environment and particularly may be an automotive headlamp. Lighting system 100 includes a light conversion block 110 on a reflective substrate 120. Substrate 120 may include, may be mounted on or attached to, or may be a region of a heat-conductive substrate or heatsink 130. An interconnector, which has several alternative implementations described further below, attaches light conversion block 110 to reflective substrate 120 and heatsink 130 and provides low thermal resistance so that heatsink 130 can absorb heat generated in and around light conversion block 110 and sink the heat into the ambient environment.

A light source 140, which may be remote from and not directly attached to light conversion block 110, produces light 142 as a beam that may be collimated or focused on conversion block 110 and that has a spectral distribution peaked about a relatively short wavelength, e.g., blue light. Remote positioning of light source 140 allows conversion block 110 to be smaller than light source 140 and allows use of multiple light sources to pump a small conversion block 110 with high intensity incident light. Remote positioning may also prevent thermal energy in light source 140 from heating light conversion block 110. Light source 140 may include a laser system, particularly a semiconductor light source such as a laser diode, or other light source that produces light 142 as one or more collimated or focused beams that are directed to efficiently couple into and pump conversion block 110. Light source 140 may be mounted on heatsink 130 or any structure (not shown) that positions light source 140 to direct light onto conversion block 110. To produce bright white light, light source 140 pumps light conversion block 110 with high intensity light, which in some implementations may be provided using one or multiple laser diodes or other light beam sources. Further, in some implementations, light source 140 may include an optical fiber or other optical systems to focus, concentrate, or otherwise direct light into a small light conversion block 110, e.g., a light conversion block having an area less than about 0.5 mm$^2$.

Light conversion block 110 converts or alters the spectral distribution of incident light 142 by converting at least some of incident light 142 to light 144 having longer wavelengths. In particular, photons of incident light 142 from light source 140 may be reflected, scattered, or absorbed at the surface or inside light conversion block 110. When light conversion block 110 absorbs a photon of the incident light, the solid-state structure of light conversion block 110 gains energy and may enter an excited state. The excited state may subsequently decay and release all or a portion of the absorbed energy by emitting a photon. When the emitted photon has less energy than the absorbed photon, the emitted photon has a wavelength that is longer than the wavelength of the absorbed photon. The energy difference between the absorbed photon and the emitted photon is commonly referred to as the Stokes shift, and the absorbed energy not taken by the emitted photon may become heat energy or energy of motion in the atomic structure of light conversion block 110. In FIG. 1, some light 144 emerging from light conversion block 110 may be converted to include longer wavelengths, and the converted light 144 usually has a broader spectral distribution than found in incident light 142. Some light 146 from conversion block 110 may be unconverted and have the same spectral distribution as the incident light 142. The combination of converted and unconverted light 144 and 146 may provide system 100 with an emitted spectral distribution that appears white.

Many factors can impact conversion efficiency of light conversion block 110, but one of the most important factors is temperature. With high-power excitation of a small phosphor volume, limited reflectivity of reflective substrate 120 or other portions of system 100 may result in high absorption, together with Stokes shift losses converting a significant fraction of incident light 142 energy into heat. If the heat is not extracted effectively from block 110, thermal quenching can result and significantly limit the light conversion efficiency of light conversion block 110. (Thermal quenching may be characterized by non-radiative transitions of atomic states in a phosphor which may start to dominate the radiative transitions with increasing phosphor temperatures.) The practical consequence of thermal quenching may be further loss of light conversion efficiency of light conversion block 110 and progressive overheating. In other words, high density laser excitation of a small light conversion (phosphor) block may cause high heat generation due to Stokes shift losses and due to non-ideal reflectivity of a converter package containing the light conversion block. Typical power densities for a white light conversion system with luminance of about 500 MCd/m$^2$ can reach the order of 10 to 50 W/mm$^2$, which tends to induce high temperatures that limit the optical performance of the light conversion material resulting in the efficiency drop due to thermal quenching. Packages using interconnectors, as disclosed herein, may yield high optical efficiency even for brightness above about 500 MCd/m$^2$ by controlling and reducing thermal resistance (and therefore improving cooling) of phosphors while maintaining high optical reflectivity (and therefore reducing absorption).

Interconnector structures and processes may particularly minimize thermal resistance of the interface between a light conversion block and a heat-conductive substrate, while maintaining high optical efficiency for light wavelength conversion and light reflection. The following discloses alternative interconnector structures and processes that may employ gluing, soldering, or mechanical clamping of a light conversion block to a substrate.

Figure 2A:
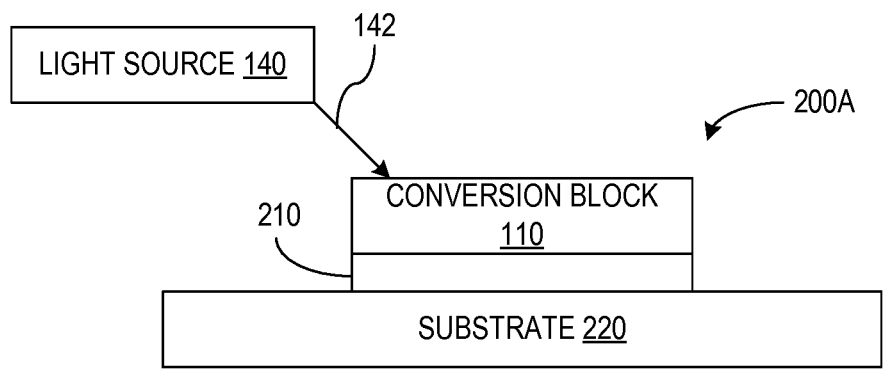
FIG. 2A shows an implementation of a light conversion package using a glue layer as an interconnector to fix a light conversion block on a substrate and to minimize thermal resistance between the light conversion block and a substrate.

FIG. 2A shows an example implementation of a reflective light-converter package 200A in which an interconnector 210 includes a layer of glue that attaches a light conversion block 110 to a substrate 220. In general, light conversion package 200A may be integrated together with a laser/semiconductor lighting device such as light source 140, and substrate 220 may include a reflective substrate 120 and a heatsink 130 such as illustrated in FIG. 1.

Light conversion block 110 is made of a material that able to convert or alter the wavelength or spectral distribution of incident light and, for effective heat extraction, the material in light conversion block 110 may have a high thermal conductivity. For example, light conversion block 110 may be a ceramic phosphor, and in one particular implementation, light conversion block 110 is Lumiramic™, developed by Philips Lumileds. Light conversion block 110 may particularly be a polycrystalline ceramic plate of Ce (III) doped yttrium gadolinium aluminum garnet (Y,GdAG:Ce). Light conversion block 110 more generally may contain a material that when irradiated by blue or other short wavelength light produces white light, e.g., light having a correlated color temperature (CCT) between about 2700 and about 7000 K depending on the specific implementation. The thickness of light conversion block 110 may be selected according to the thermal resistance of interconnector 210, thermal conductivity of the material of which block 110 is made, the amount of converted or incident luminous power, and the maximum allowed temperature of a lamp or other device containing light conversion block 110. In an exemplary implementation, light conversion block 110 has an area about 0.5 mm by 0.5 mm or less and has a thickness between about 30 and 150 microns.

Interconnector 210 may have high thermal conductivity and may be optically and thermo-mechanically stable as well as optically transparent in the operating ranges for luminous flux and temperature in package 200A. In one implementation, interconnector 210 is a layer of a silicone based glue. Silicone glues are commonly stable up to 200° C., which is generally compatible with the temperature range of light conversion block 110 in a high luminous flux application. The silicone glue may be methyl or methyl/phenyl based. In general, replacing methyl groups with phenyl groups in a silicone formulation raises the index of refraction of interconnector 210 and increases the high temperature tolerance of interconnector 210. An example of a commercially available glue suitable for interconnector 210 is KJR 9224 made by Shin-etsu Chemical Company, Ltd. The choice of a specific silicone glue for a particular implementation of interconnector 210 may be based on the desired refractive index, transparency and thermal stability of the silicone glue. In general, the refractive index of a silicone may be adjusted by altering the groups that terminate the silicone molecule. For an index of refraction less than about 1.4 to 1.43 depending on the wavelength of light, a methyl-based silicone may be used. Transparency and thermal stability generally require an optical grade of silicone, which is commercially available from several silicone manufacturers. The thermal conductivity and the thickness of interconnector 210 determines thermal performance of interconnector 210 because thermal resistance per area is proportional to the thickness of layer 210. Layer 210 may be made as thin as possible while still providing sufficient adhesion of light interconnector 210 to substrate 220. A glue layer thickness of about 1 to 2 microns or less, may be effective for heat extraction from phosphor 110 into substrate 120.

In an exemplary implementation, interconnector 210 is a one-micron thick silicone glue layer that provides a thermal conductance of about 0.2 W/mm$^2$·K. For a 0.3 mm×0.3 mm light conversion block 110, this results in a thermal resistance of about 5 K mm$^2$/W to reflective substrate 120, which allows dissipation of 1 W of thermal power in an ambient temperature of about 85° C., while keeping temperature of light conversion block 110 below the quenching limit.

Light conversion block 110 and substrate 220 should have surface finishes that permit adhesion with a thin, e.g., 1 to 2 µm, adhesive or glue. Roughness in the adjacent surfaces of light conversion block 110 or substrate 220 may inhibit adhesion and contribute to variation in the thickness of interconnector 210. For reliable control of a glue layer thickness of about 1 micron, adjacent surfaces of block 110 and substrate 220 should have highly smooth surfaces, e.g., surface roughness much less than 1 micron. The surfaces of light conversion block 110 and substrate 220 may be polished to achieve surface roughness with an amplitude in a submicron range before light conversion block 110 is glued to substrate 220.

Substrate 220 may have a highly reflective surface area under and around light conversion block 110, be thermally conductive, and include a heatsink such as heatsink 130 of FIG. 1 on which one or more reflective regions such as substrate 120 of FIG. 1 are formed or attached. For a reflective surface, aluminum-based reflective materials (Miro- or Miro-silver types) such as commercially available from ALANOD® GmbH & Co.KG can be used. The reflective surface finish may provide either specular or diffuse reflection. Diffuse reflection from substrate 120, however, may be desired to enhance color mixing in the angular space of light emerging from the light conversion block 110.

Figure 2B:
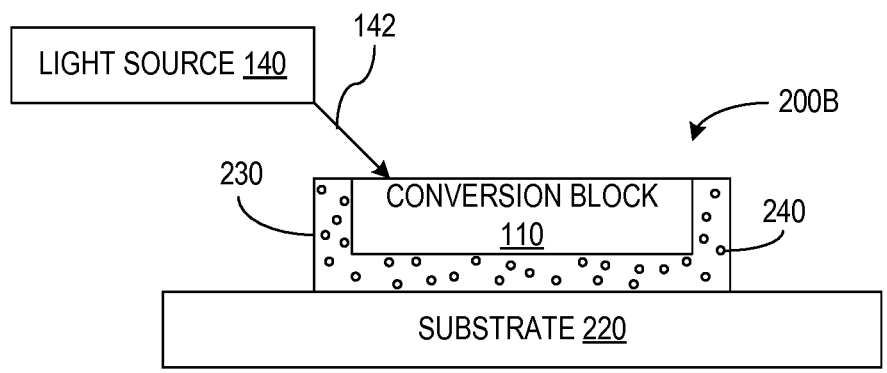
FIG. 2B shows an implementation of a light conversion unit with an interconnector including a reflective glue layer that extends onto the sides of light conversion block.

FIG. 2B shows an implementation of a light conversion package 200B that may include the features described above with reference to FIG. 2A but that employs an alternative interconnector 230. Interconnector 230 differs from interconnector 210 in that interconnector 230 includes particles 240 introduced into a glue layer, e.g., in a silicone glue, used to attach light conversion block 110 to substrate 220. For example, addition of metal oxide particles, e.g., aluminum oxide ($Al_2O_3$) or titanium dioxide ($TiO_2$) particles that are about 400 nm or less in diameter, to a silicone glue can increase thermal conductivity and therefore enhance the thermal performance of interconnector 230, relative to a layer of pure silicone glue. Additionally, particles 240, which may have a high refractive index, when mixed in a low-refractive-index glue such as a silicone glue may effectively scatter and reflect of light (especially for high particle densities). Depending on the particle concentration and layer thickness, the reflectivity of a scattering glue of this type can reach about 97 to 98% for light in the visible spectral range, and the reflectivity of the glue layer is in addition to reflection from substrate 220. Interconnector 230 may thus increase the reflectivity of light conversion package 200B and may improve mixing of the converted and unconverted light radiating from light conversion package 200B. As a result, light conversion package 200B may achieve higher optical efficiency and improved beam properties such as better angular and spatial color uniformity of the light emerging from light conversion package 200B.

Interconnector 230 also differs from interconnector 210 in that interconnector 230 coats the sides of light conversion block 110 in addition to being between light conversion block 110 and substrate 220. In particular, interconnector 230 may cover the entirety of the sides of conversion block 110 and leave a top surface of conversion block 110 entirely uncovered. The side coatings increase the area of contact of interconnector 230 and light conversion block 110, which may further reduce the thermal resistance between block 110 and substrate 220. Side coating can also improve optical efficiency because covering the sides of light conversion block 110 with scattering/reflecting material helps to recycle the light that might otherwise be emitted in undesired directions, e.g., from the sides of light conversion block 110. Effective total brightness of light conversion package 200B may thus be increased since interconnector 230 directs more light in the desired directions.

Figure 3A:
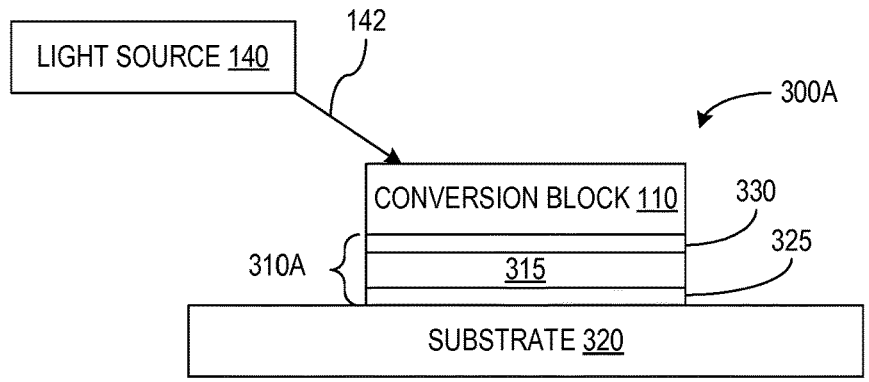
FIG. 3A shows an implementation of a light conversion package including a light conversion block with a reflective metal layer that allows soldering of the block to a heat-conductive substrate.

Soldering can provide an alternative implementation of a low thermal resistance interconnector between a light conversion block and a substrate (heatsink). FIG. 3A shows an example of a light conversion package 300A including an interconnector 310A with a solder region 315 between a light conversion block 110 and a substrate 320. The soldering approach may further use a metal layer (or stack of metal layers) 330 formed on the bottom of light conversion block 110 and a metal layer (or stack of metal layers) 325 formed on top on substrate 320. The composition of metal layers 330 and 325 may be chosen for reflectivity and for adhesion respectively to light conversion block 110 and substrate 320 and adhesion to solder layer 315. Metals in general are excellent thermal conductors and the total thickness of interconnector 310A may be about 4 to 60 µm. For example, solder layer 315 may be about 2 to 50 µm, metal layer 330 may be about 1 to 5 µm, and metal layer 325 may be about 1 to 2 µm to provide thermal resistance significantly less than about 10 K mm$^2$/W.

Interconnector 310A, including metal layers 315, 325, and 330, is generally reflective and opaque to visible light. Accordingly, interconnector 310A may reflect some of the light converted in or transmitted through light conversion block 110. To improve reflectivity of interconnector 310A, metal layer 330 may include a highly reflective metal such as aluminum or silver that is deposited directly on light conversion block 110. Since reflections occur at layer 330 in the implementation of FIG. 3A, reflectivity may not be necessary at the surfaces of solder layer 315, metal layer 325, or substrate 320. Substrate 320 may, however, be reflective and heat-conductive or substantially identical to substrate 220, which may be reflective and heat-conductive as described above.

Figure 3B:
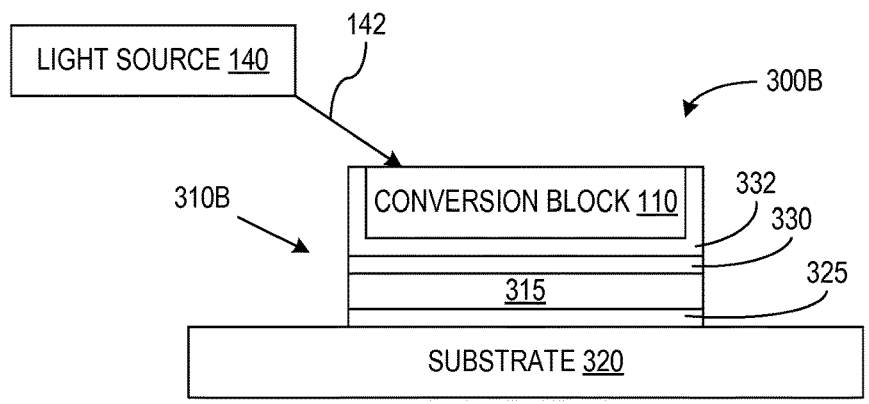
FIG. 3B shows an implementation of a light conversion package including a light conversion block with a reflective metal layer on bottom and side surfaces of the block.

FIG. 3B illustrates a light conversion package 300B in which a metal layer 332 on light conversion block 110 extends across the bottom and up the sides of light conversion block 110. Having interconnector 310B also on the sides of light conversion layer 110 increases the area of contact with block 110, which may reduce the thermal resistance between light conversion block 110 and substrate 320. Metal layer 332, being on the sides of conversion layer 110 may also reflect light that might be lost out the side of light conversion block 110 and may direct the reflected light to more desirable directions for light exiting package 300B.

Metals such as aluminum and silver have high reflectance coefficients and are widely used for optical mirrors, but in some implementations, relying solely on reflections from a metal, e.g., layer 330 or 332, directly deposited on light conversion block 110 may result in significant absorption of light and a corresponding loss of conversion efficiency. In particular, the phosphor materials in light conversion block 110 may have a large number of light scattering centers spread throughout the volume of light conversion block 110. As a result, light in block 110 may experience multiple scattering events and multiple reflections from the surfaces of conversion block 110 before the light exits light conversion package 300A or 300B. The effective reflectivity of metal layer 330 or 332 decreases in a geometrical progression with the number of reflections from metal layer 330 or 332, and even for highly-reflective silver, the average number of reflections from the bottom or sides of light conversion block 110 that light experiences before exiting can drop the effective reflectivity of metal layer 330 or 332 to about 85% or lower. The effects of multiple reflections can similarly cause the effective reflectivity of an aluminum layer to be on the order of 65% or less. Accordingly, direct metal deposition on the light conversion material in block 110 may result in low effective reflectivity and therefore low conversion efficiency for some implementations of package 300A or 300B.

Figure 3C:
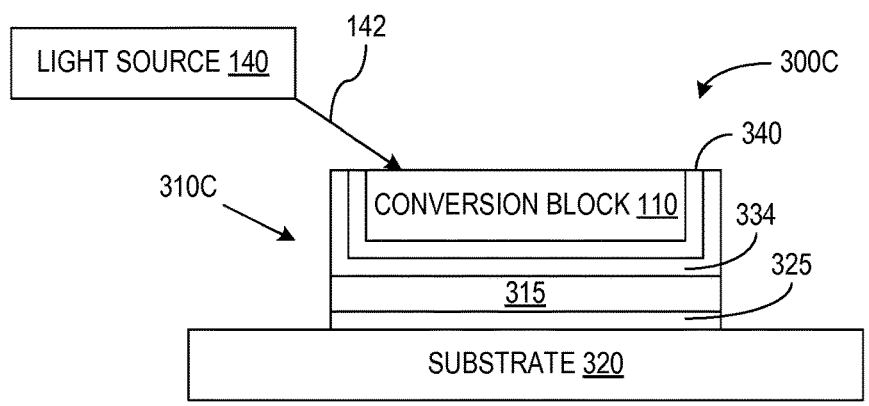
FIG. 3C shows an implementation of a light conversion package including a light conversion block with a reflection layer such as a low refractive index layer or Bragg mirror between the light conversion block and a heat-conductive substrate.

The layer in contact with light conversion block 110 may alternatively be highly reflective so that absorptive losses even after multiple reflections are low. A light conversion package 300C and interconnector 310C shown in FIG. 3C achieve high reflectivity at the bottom and sides of light conversion block 110 through addition of a reflection layer 340 between a metal layer 334 and conversion block 110. Reflection layer 340 may, for example, be a cladding layer of low refractive index material such as silicon dioxide ($SiO_2$), which may be on the order of 100 to 300 nm thick. When light conversion block 110 is made of a material with a high refractive index, e.g., a Ce:YAG ceramic, light in the high refractive index material of block 110 propagating to the interface with low refractive index material of layer 340 may experience total internal reflection at a range of incidence angles. With total internal reflection, 100% reflectivity can be achieved in block 110 for light incident on an optical interface at angles outside the escape cone, and light that is not reflected at the interface with layer 340 may still be reflected from metal layer 334. The total internal reflection, thus, can improve the reflectivity at the bottom and sides of light conversion block 110 and therefore improve optical performance of light conversion block 110. Reflection layer 340 may be thin, e.g., less than about 300 nm thick, so that an interconnector 310C including layer 340 does not impose a significant increase in thermal resistance between light conversion block 110 and heat-conductive substrate 320.

High optical performance may alternatively be achieved when reflection layer 340 is a dielectric stack or Bragg mirror, formed by alternating layers of lower and higher refractive index materials. For example, layers of lower refractive index materials such as silicon dioxide ($SiO_2$) or aluminum oxide ($Al_2O_3$) may be alternated with layers of higher refractive index materials such as niobium pentoxide ($Nb_2O_5$), tantalum pentoxide ($Ta_2O_5$), or titanium dioxide ($TiO_2$). On the dielectric mirror stack, metal layer 334 may be reflective to reflect light that may pass through reflection layer 340 and may further serve as interface between reflection layer 340 and solder stack 315. Some commonly-used reflective interface metals include silver (Ag), aluminum (Al), and nickel-gold (Ni—Au), which are also suitable for use with a solder such as a tin-gold (Sn—Au) solder in layer 315. When reflection layer 340 is a Bragg mirror, layer 340 can be designed to provide ultra-high reflectivity for a broad wavelength band and a wide angular range due to light interference in a multi-layer optical structure.

Using a higher number of dielectric layers and a higher refractive index difference between the materials may allow a Bragg mirror to achieve higher reflectivity and a broader incident angular range for reflections. However, increasing the number of layers in layer 340 (and consequently the total thickness of layer 340) may have a negative effect on the thermal conductivity of interconnector 310C. For example, considering the multiple reflections in a package, reflection layer 340 containing 42 alternating layers of $SiO_2$ and $Ta_2O_5$ can achieve an effective package reflectivity of about 88% and a heat transfer coefficient of about 0.1 $W/mm^2 K$, and reflection layer 340 having six layers provides an effective package reflectivity of about 82% and a heat transfer coefficient of about 1.5 $W/mm^{2o} K$. More generally, specific application requirements such as the optical and thermal parameters of layer 340 may be achieved in a package by selecting suitable characteristics for the Bragg mirror, e.g., selecting materials having suitable refractive indices and thermal conductivities and selecting the layer thicknesses and the number of layers in the stack.

Figure 3D:
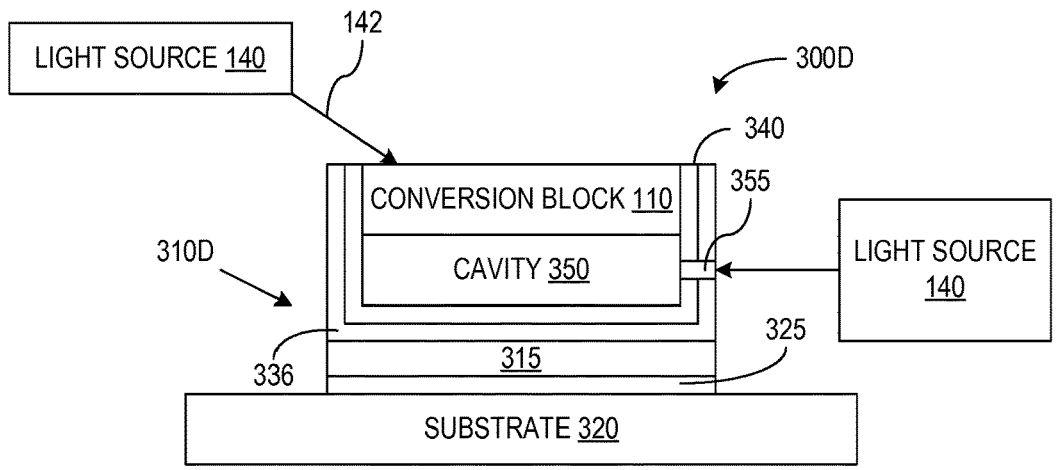
FIG. 3D shows an implementation of a light conversion package including a light conversion block with an underlying optical cavity and a light passage through the reflection layer on surfaces of the conversion block and the optical cavity.

FIG. 3D shows a package structure 300D including an interconnector 310D in accordance with an implementation including an optical cavity 350. Optical cavity 350 may be a layer or block of transparent material that is adjacent to, e.g., under, light conversion block 110. Optical cavity 350 may particularly contain a non-converting transparent material, while light conversion block 110 contains a converting material, e.g., a phosphor. Reflection layer 340, which may be a low-index cladding layer or a Bragg mirror as described above, may be around all sides of light conversion block 110 and on the side walls and the bottom of optical cavity 350. Pump light, e.g., from one or more light source 140 can be coupled into cavity 350 through a light passage 355, e.g., an opening or a waveguide passing through interconnector 310D or particularly through layers 334 and 340, at one or more of the sidewalls of cavity 350. Light pumped into cavity 350 may reflect at the interface of cavity 350 and reflection layer 340 and interact with conversion block 110. As noted above, conversion block 110 may convert the wavelength of some of the pump light into light have longer wavelengths, and portions of the converted and unconverted light may exit from the top surface of conversion block 110 or may reenter cavity 350 through the bottom surface of conversion block 110. Cavity 350 may thus provide an efficient path for applying pump light to conversion block 110 and for mixing converted and unconverted light.

Light conversion block 110, which may be a layer of phosphor or ceramic phosphor as described above, may be formed or positioned adjacent to, e.g., on top of, cavity 350. Accordingly, cavity 350 may be made of a material having a high thermal conductivity to achieve a good heat transfer from light conversion block 110 through optical cavity 350 to substrate 320. In one implementations, cavity 350 is a block of sapphire with a defined thickness, e.g., 500 microns or less thick. Additionally to achieve efficient light and color mixing, cavity 350 may include scattering centers. For example, cavity 350 may include polycrystalline alumina (PCA). Reflection layer 340 and metal layer 334 can be formed on the bottom and the sidewalls of the combined conversion block 110 and cavity 350, e.g., using a process including deposition of mirror layers as described above. For thermal conductivity, a metal layer 336 below optical cavity 350 may act as an adhesion layer that allows the assembly including conversion block 110 and cavity 350 to be soldered onto adhesion metal layer or stack 325 on heat-conductive substrate 320. Alternatively, the combination of conversion block 110 and cavity 350 with reflection layer 340 may be glued to a heatsink structure, e.g., using a silicone glue such as described above or a mechanical mounting system such as described below, to provide a high thermal conductivity contact to a substrate or other heatsink structure.

Figure 4A:
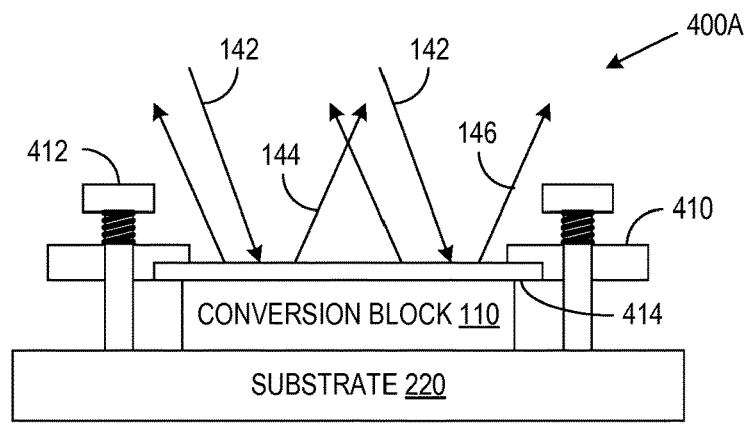
FIGS. 4A and 4B show implementations of light conversion packages employing a mechanical mounting as an interconnector attaching a light conversion block to a reflective substrate and applying pressure to control thermal resistance between the block and the substrate.

An interconnector for a light conversion block may alternatively provide a low thermal resistance between a light conversion block and a heat-conductive substrate by avoiding use of any intervening material between the light conversion block and the heat-conductive substrate. For example, FIG. 4A shows a light conversion package 400A that uses mechanical clamp 410 to mount a light conversion block 110 on a substrate 220 and to apply sufficient pressure to produce low thermal resistance between conversion block 110 and substrate 220. Clamp 410 may particularly employ a mounting 412 that presses an optical element 410 against a top surface of light conversion block 110 with sufficient force to obtain direct thermal contact between light conversion block 110 and heat-conductive substrate 220. Substrate 220 is heat conductive and may be highly reflective to maintain light conversion block 110 at an operating temperature that provides high optical efficiency. In one implementation, mounting 412 employs an adjustable, spring-based clamp that applies clamping force that can be adjusted to achieve a low thermal resistance, e.g., by increasing the spring force as needed to reduce the thermal resistance. Typically, a clamping pressure greater than about 20 MPa may be required to obtain a sufficiently high thermal interface conductance, e.g., greater than about 0.1 $W/mm^2K$, between a Lumiramic™ light conversion block 110 and a reflective surface of substrate 220 in a high-luminance lighting system.

The mechanics of clamp 410 can be implemented in different ways depending on the choice of optical element 414. In general, the particular mechanical structure used in a package structure may depend on the optical interface were light is coupled out of light conversion block 110. An example could be a structure were a compound parabolic concentrator (CPC) is clamped to the phosphor. When a phosphor is clamped between a heatsink and an optical element, the dimensions, thermal conductive properties of the materials, and clamping force are primary factors that affect the heat dissipation.

Figure 4B:
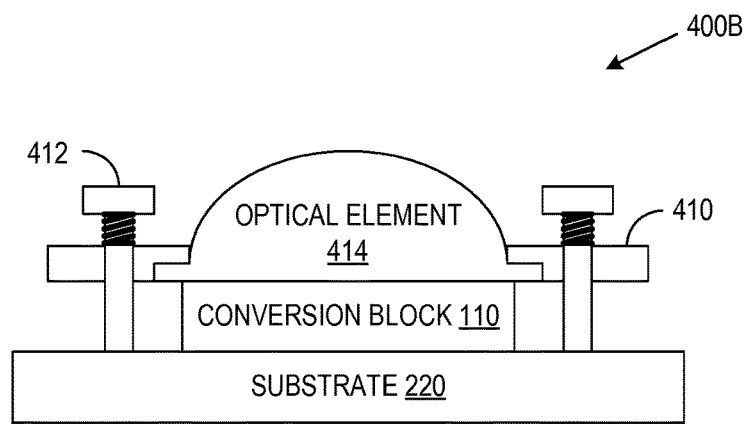

FIG. 4A illustrates an example in which optical element 414 is a flat window made of a transparent material such as sapphire or glass. Alternatively, optical element can be any optical structure having one surface shaped to engage light conversion block 110 and another surface shaped to achieve a desired optical function. FIG. 4B, for example, illustrates and example of a package structure 400B in which an optical element 414 is a dome or a plano-convex lens having a flat side adjacent to a flat surface of light conversion block 110. More generally, the bottom surface of optical element 414 may be shaped for thermal contact with conversion block 110. The top surface of optical element 414 in FIG. 4B is hemispherical, so that optical element 414 tends to focus, collimate, reduce divergence or otherwise helps extracting the light from light conversion block 110 in the implementation of FIG. 4B. In addition to element shape, an optical coating can be provided on a top surface of optical element 414 for optical functions such as correcting for possible color variations over the emission angle of the light source. Additionally, the outer surface of optical element 414 may include micro-structures that are patterned to help extract more light emitted from light conversion block 110 and to provide preliminary beam-shaping function on emerging light 144 and 146.

Clamp 410 in addition to creating a thermal path from the bottom surface of conversion block 110 to substrate 220 also provide an additional heat extraction channel to cool light conversion block 110 from the top surface of block 110 to substrate 220, which may sink the heat to the surrounding environment. To enhance this channel of heat extraction, optical element 414 may be made of optical materials with relatively high thermal conductivity, e.g., sapphire or calcium fluorite ($CaF_2$) or other material providing a high thermal conductivity, e.g., above about 10 W/m K or greater. As mentioned above, the bottom surface of optical element 414 may be shaped to provide a thermo-mechanical contact between optical element 144 and light conversion block 110.

Although particular implementations have been disclosed, these implementations are only examples and should not be taken as limitations. Various adaptations and combinations of features of the implementations disclosed are within the scope of the following claims.

The invention claimed is:

1. A lighting system comprising:
a light source;
a light conversion block having a top surface and a bottom surface, the light conversion block positioned such that the top surface receives an output light from the light source and converts at least a portion of the output light from the light source to a converted light with a spectral distribution that differs from the spectral distribution of the output light from the light source, the light conversion block having an area of 0.5 mm by 0.5 mm or less;
a substrate having a top surface and a bottom surface, at least the top surface of the substrate being reflective and covering at least the entire bottom surface of the light conversion block; and
an interconnector between the bottom surface of the light conversion block and the top surface of the substrate, the interconnector comprising:
a first metal layer under the bottom surface of the light conversion block and having a thickness in a range of 1 μm to 5 μm,
a second metal layer on a top surface of the substrate and having a thickness in a range of 1 μm to 2 μm,
a third metal layer that extends on sides of the light conversion block between the light conversion block and the first metal layer, and
a solder region between the first metal layer and the second metal layer and having a thickness in a range of 2 μm to 50 μm,
the interconnector and the substrate configured to reflect the output light from the light source and the converted light with a reflectivity greater than 85% such that the converted light and output light from the light source exit the light conversion block through the top surface.

2. The light conversion system of claim 1, wherein the reflectivity is greater than 90%.

3. The light conversion system of claim 1, wherein the reflectivity is greater than 97%.

4. The system of claim 1, wherein the light conversion block has a thickness between to and 150 microns.

5. The system according to claim 1, wherein the solder region of the interconnector comprises a solder layer.

6. The system according to claim 1, wherein the light source comprises a laser.

7. The system according to claim 1, wherein the lighting system is a lamp or an automotive headlamp.

\* \* \* \* \*